United States Patent
Lin et al.

(10) Patent No.: US 6,197,680 B1
(45) Date of Patent: Mar. 6, 2001

(54) METHOD FOR FORMING CONDUCTIVE LINE

(75) Inventors: Jiunn-Hsien Lin, Yungkang; Wen-Pin Kuo, Hsinchu, both of (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/313,510

(22) Filed: May 17, 1999

(30) Foreign Application Priority Data

Jan. 25, 1999 (TW) .................................................. 88101058

(51) Int. Cl.⁷ ................................................. H01L 21/4763
(52) U.S. Cl. ............................................. 438/637; 438/631
(58) Field of Search .................................. 438/637, 626, 438/629, 648, 631, 691, 773; 156/643, 656; 430/313, 317, 318, 325

(56) References Cited

U.S. PATENT DOCUMENTS

| | | | |
|---|---|---|---|
| 5,143,820 | * 9/1992 | Kotecha et al. | 430/314 |
| 5,702,564 | * 12/1997 | Shen | 156/643 |
| 5,817,573 | * 10/1998 | Rhodes et al. | 438/626 |
| 5,863,707 | * 1/1999 | Lin | 430/313 |

* cited by examiner

Primary Examiner—David Nelms
Assistant Examiner—Phuc T. Dang
(74) Attorney, Agent, or Firm—Jiawei Huang; J C Patents

(57) ABSTRACT

An improved method of forming a conductive line on a semiconductor substrate is described. A conductive layer is formed on the substrate. A patterned photoresist layer is formed on the conductive layer. A first etching step is performed on the conductive layer to define the conductive layer and to form a conductive line. A second etching step is performed on the conductive line to undercut the conductive line so as to make the conductive line have smaller bottom and to increase a distance between neighboring conductive lines. A third etching step is performed to remove residue generated on the substrate during the first and the second etching steps. A dielectric layer is formed to cover the conductive line. A planarization process is performed.

27 Claims, 3 Drawing Sheets

METHOD FOR FORMING CONDUCTIVE LINE

CROSS-REFERENCE TO RELATED APPLICATION

This application claims the priority benefit of Taiwan application serial no. 88101058, filed Jan. 25, 1999, the full disclosure of which is incorporated herein by reference.

BACKGROUND OF THE INVENTION

1. Field of Invention

The present invention relates to a method for forming a semiconductor device. More particularly, the present invention relates to a method for forming a conductive layer.

2. Description of Related Art

As a line width of a semiconductor device is gradually minimized, the distance between two neighboring conductive lines is gradually reduced. However, the shorter the distance between the two neighboring conductive lines is, the more serious a parasitic capacitor effect is. A parasitic capacitor is generated between the two neighboring conductive lines. A parasitic capacitor effect is affected by a dielectric constant of the dielectric layer and a distance between the two neighboring conductive lines. Consequently, a high dielectric constant and a small distance between the two neighboring conductive lines both easily cause a parasitic capacitor. When the parasitic capacitor effect is serious, resistance capacitance (RC) time delay is increased so as to decrease transferring speed in integrated circuits.

FIG. 1 is a schematic, cross-sectional view of a conductive line.

Referring to FIG. 1, a metallic layer (not shown) is formed on a semiconductor substrate 100. A photoresist layer (not shown) having a pattern of a subsequently formed metal line is formed on the metallic layer. Two etching steps are performed on the metallic layer. Using the photoresist layer as a mask, a first etching step is performed on the metallic layer to form a metal line 102. A second etching step is performed on the metal line 102 to clean away residue generated on the substrate 100 during the first etching step. A dielectric layer 104 is formed over the substrate 100 to cover the metal line 102. An air gap 106 is commonly formed in the dielectric layer 104 between the two neighboring metal lines 102. A dielectric layer 104a including the air gap 106 and the dielectric layer 104 is formed. Since the air gap 106 exists in the dielectric layer 104, the dielectric constant of the dielectric layer 104a can be minimized.

However, the conventionally formed conductive line 102 has a tapered profile, as shown in FIG. 1. In other words, the conductive line 102 has a wider bottom than the top. Hence, a distance between the two neighboring metal lines is decreased. While forming the dielectric layer 104 on the substrate 100, the dielectric layer 104 has a better coverage ability because the conductive line 102 has a tapered profile. Consequently, the dielectric layer 104 easily fills an area between the two neighboring metal lines so that the air gap 106 becomes smaller. Thus, the air gap 106 cannot efficiently reduce the dielectric constant of the dielectric layer 104a so as to increase a parasitic capacitor induced between the two metal lines 102.

Moreover, the conventionally formed metal line 102 has a tapered profile so as to decrease a distance between the two neighboring metal lines 102. Consequently, a parasitic capacitor generated between the two metal lines 102 is also increased.

SUMMARY OF THE INVENTION

Accordingly, the present invention provides an improved method for forming a conductive layer. The method can increase a distance between the two neighboring conductive lines. Moreover, the invention can form a larger air gap than the conventionally formed air gap in the dielectric layer so that the dielectric layer has a lower dielectric constant. Therefore, a parasitic capacitor induced between the conductive lines can be improved.

The invention provides an improved method for forming a conductive layer on a semiconductor substrate. A conductive layer is formed on the substrate. A photolithography step is performed on the conductive layer. A first etching step is performed on the conductive layer to form a plurality of conductive lines. A second etching step is performed on the plurality of the conductive lines to undercut the plurality of the conductive lines so as to make the plurality of the conductive lines have a smaller bottom and to increase a distance between the two neighboring conductive lines. A third etching step is performed to remove a residue produced on the substrate during the first and the second etching steps. A dielectric layer is formed to cover the conductive line. A planarization process is performed on the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
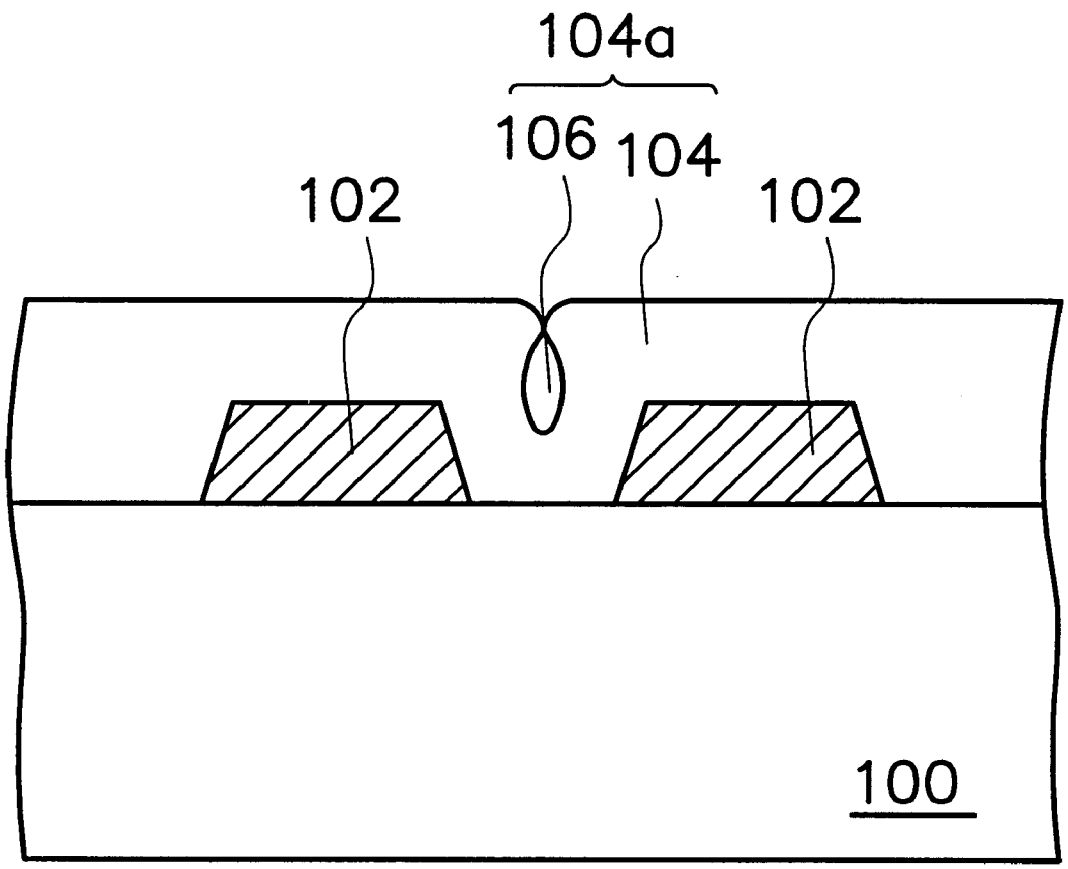
FIG. 1 is a schematic, cross-sectional view of a conductive line.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing a method of forming a conductive line according to one preferred embodiment of this invention.

Figure 2A:
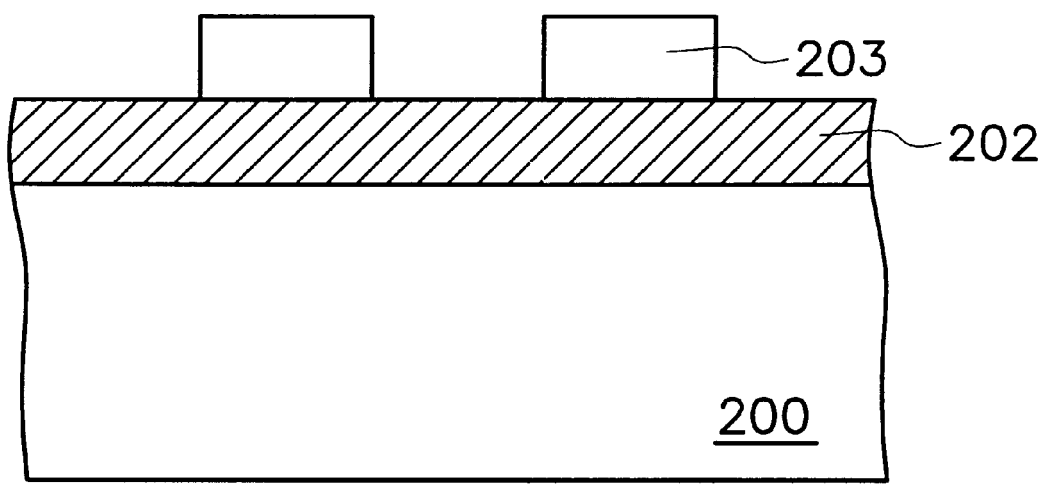
FIGS. 2A through 2D are schematic, cross-sectional views showing a method of forming a conductive line according to one preferred embodiment of this invention.

Referring to FIG. 2A, a semiconductor substrate 200 is provided. The substrate 200 comprises semiconductor devices (not shown) and a dielectric layer (not shown) formed thereon. A conductive layer 202 is formed on the substrate 200. A photolithography step is performed on the conductive layer 202. The photolithography step includes forming a photoresist layer 203 with a conductive line pattern on the conductive layer 202.

Figure 2B:
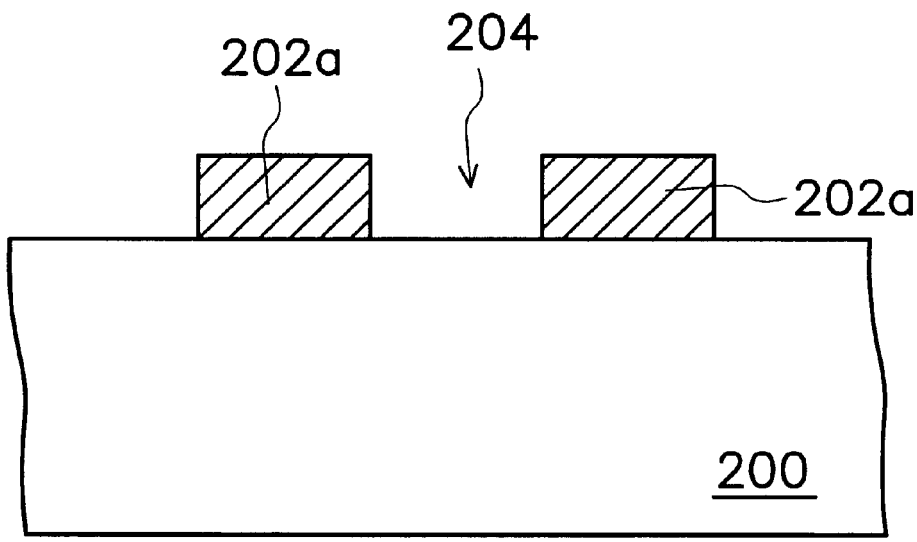

Turning to FIG. 2B, using the patterned photoresist layer 203 (FIG. 2A) as a mask, a first etching step such as dry etching is performed on the conductive layer 202 (FIG. 2A). The conductive layer 202 (FIG. 2A) is etched to form a conductive line 202a. An opening 204 is formed between the neighboring conductive lines 202a. The condition of the first etching step includes supplying a bias power in the range of from about 150 to 250 W. A mixture of etching gases including chloride Gas ($Cl_2$) and $BCl_3$ gas serves as an etching gas, for example. The flow rate of chloride gas ($Cl_2$) is preferably controlled at approximately 45~55 sccm (Standard Cubic Centimeter Per Minute, i.e., cm/min or ml/min). The flow rate of $BCl_3$ gas is preferably controlled at approximately 55~65 sccm. During the first etching step, some polymer may be generated because of the etching reaction. The polymer remains beside the conductive line 202a on the substrate 200 so that the conductive line 202a has a slightly tapered profile. Nevertheless, the first etching step in the invention has a faster etching rate than the conventional etching step. Hence, the photoresist layer (FIG. 2A) residue does not easily remain on the substrate after etching. Therefore, the profile of the conventionally formed conductive line is more tapered than that of the conductive line 202a in the invention.

Figure 2C:
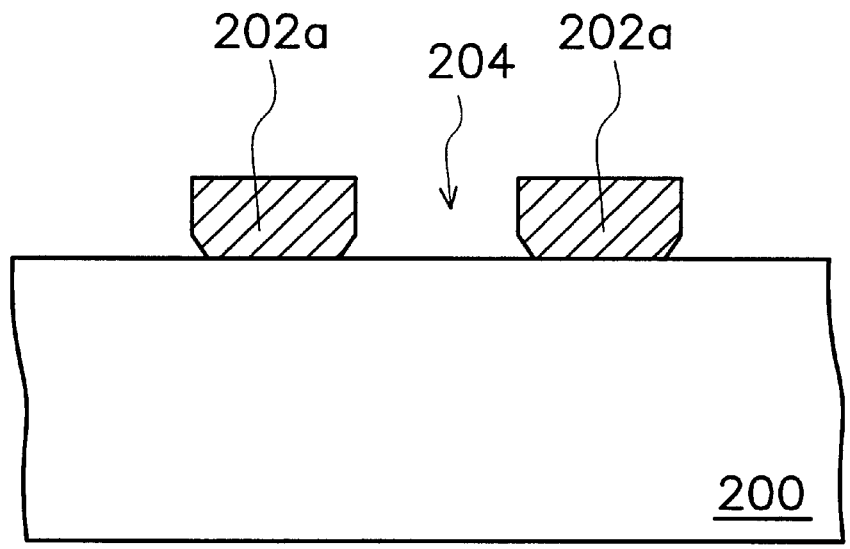

Turning to FIG. 2C, a second etching step such as dry etching is performed on the conductive line 202a to undercut the conductive lines 202a. The condition of the second etching step includes supplying a bias power in the range of from about to 150 W. A mixture of etching gases including chloride gas ($Cl_2$) and $BCl_3$ gas serves as an etching gas, for example. The flow rate of chloride gas ($Cl_2$) is preferably controlled at approximately 45~55 sccm. The flow rate of $BCl_3$ gas is preferably controlled at approximately 45~55 sccm. The second etching step is to undercut the conductive line 202a to make the conductive lines 202a have a smaller bottom than the top so as to increase a distance between the two neighboring conductive lines 202a. Consequently, a parasitic capacitance induced by a small distance between the conductive lines can be improved. Additionally, since the conductive lines 202a have a smaller bottom, a step coverage ability is decreased while subsequently forming a dielectric layer to fill the opening 204 between the two neighboring conductive lines 202a.

A third etching step such as dry etching is performed on the conductive line 202a to remove residue (not shown) produced on the substrate 200 during the first and the second etching steps. The condition of the third etching step includes supplying a bias power in the range of from about 60 to 100 W. A mixture of etching gases including chloride gas ($Cl_2$) and $BCl_3$ gas serves as an etching gas, for example. The flow rate of chloride gas ($Cl_2$) is preferably controlled at approximately 65~75 sccm. The flow rate of $BCl_3$ gas is preferably controlled at approximately 45~55 sccm.

Figure 2D:
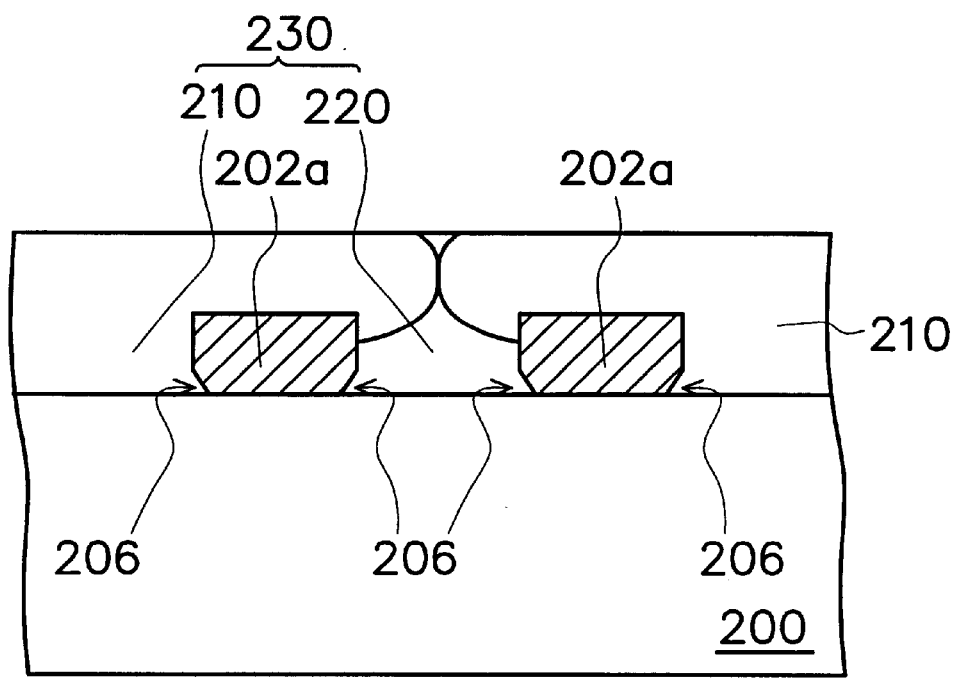

Turning to FIG. 2D, a dielectric layer 210 such as silicon oxide is formed over the substrate 200 to cover the conductive line 202a. The dielectric layer 210 is formed by, for example, plasma enhanced chemical vapor deposition (PECVD). In the second etching step, the conductive line 202a is undercut to have a smaller bottom so that step coverage ability is decreased. Consequently, while forming the dielectric layer 210, an overhang occurs on upper portions of the sidewalls of the conductive lines 202a. Thus, because the area between the two neighboring conductive lines is not easily filled with the dielectric layer 210, an air gap 220 is formed between the neighboring conductive lines. Moreover, because a bottom part of the conductive line 202a is removed, a larger air gap than the conventionally formed air gap is generated. The air gap 220 extends to an area 206 between the substrate 200 and the conductive line 202a. A dielectric layer 230 including the air gap 220 and the dielectric layer 210 is formed. Silicon oxide has a dielectric constant of about 4.0~4.9, while air has a dielectric constant of about 1.00059. Consequently, due to the larger air gap 220 than the conventionally formed air gap, the dielectric layer 230 with a lower dielectric constant can be obtained. Because the dielectric constant of the dielectric layer 230 is reduced and the conductive line 202a is undercut to increase the distance between the two neighboring conductive lines 212a, a parasitic capacitor effect is thus improved. Moreover, RC delay time is also lowered so as to enhance device performance.

A planarization process such as chemical-mechanical polishing is performed to form a planarized dielectric layer 210.

One advantage of the invention is that the conductive line is undercut to make the conductive line have smaller bottom and to increase a distance between the two neighboring conductive lines. Therefore, parasitic capacitance induced by an insufficient distance between the conductive lines can be improved.

Another advantage is that the invention can form a larger air gap than the conventionally formed air gap in the dielectric layer. The air gap extends to an area between the substrate and the conductive line. Consequently, the dielectric layer has a lower dielectric constant, and a parasitic capacitor effect can also be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a conductive line, comprising:
   providing a semiconductor substrate;
   forming a conductive layer on the substrate;
   performing a first etching step on the conductive layer to form a plurality of conductive lines, wherein the first etching step completely removes a portion of the conductive layer between the conductive lines;
   performing a second etching step on the plurality of the conductive lines to undercut the plurality of the conductive lines so as to make the plurality of the conductive lines have a smaller bottom and to increase a distance between the two neighboring conductive lines;
   performing a third etching step to remove a residue produced on the substrate during the first and the second etching steps;
   forming a dielectric layer to cover the plurality of the conductive lines; and
   performing a planarization process on the dielectric layer.

2. The method according to claim 1, wherein the planarization process comprises chemical-mechanical polishing.

3. The method according to claim 1, wherein the dielectric layer comprises silicon oxide.

4. The method according to claim 1, wherein the first etching step comprises dry etching.

5. The method according to claim 4, wherein conditions of the first etching step comprise supplying a bias power in range of from about 150 to 250 W.

6. The method according to claim 4, wherein the first etching step comprises using chloride gas ($Cl_2$) and $BCl_2$ as an etching gas.

7. The method according to claim 6, wherein conditions of the first etching step comprise using chloride gas ($Cl_2$)

and $BCl_2$ as an etching gas with a $BCl_2$ flow rate ranging from about 55 to 65 sccm and with a $Cl_2$ flow rate ranging from about 45 to 55 sccm.

8. The method according to claim 1, wherein the second etching step comprises dry etching.

9. The method according to claim 8, wherein conditions of the second etching step comprises supplying a bias power in range of from about 50 to 150 W.

10. The method according to claim 8, wherein the second etching step comprises using chloride gas ($Cl_2$) and $BCl_2$ as an etching gas.

11. The method according to claim 10, wherein conditions of the second etching step comprise using chloride gas ($Cl_2$) and $BCl_2$ as an etching gas with a $Cl_2$ flow rate ranging from about 45 to 55 sccm and with a $BCl_2$ flow rate ranging from about 45 to 55 sccm.

12. The method according to claim 1, wherein the third etching step comprises dry etching.

13. The method according to claim 12, wherein conditions of the third etching step comprise supplying a bias power in range of from about 60 to 100 W.

14. The method according to claim 12, wherein the third etching step comprises using chloride gas ($Cl_2$) and $BCl_2$ as an etching gas.

15. The method according to claim 14, wherein conditions of the third etching step comprise using chloride gas ($Cl_2$) and $BCl_2$ as an etching gas with a $Cl_2$ flow rate ranging from about 65 to 75 sccm with a $BCl_2$ flow rate ranging from about 45 to 55 sccm.

16. A method of forming a conductive line, comprising:
    providing a semiconductor substrate;
    forming a conductive layer on the substrate;
    patterning the conductive layer to form an opening in the conductive layer, exposing a portion of the semiconductor substrate;
    undercutting the conductive layer so that the opening has a bottom wider than a top thereof;
    removing a residue produced during the patterning and the undercutting steps;
    filling the opening with a dielectric layer which comprises an air gap extending in the opening.

17. The method according to claim 16, wherein the conductive layer is patterned by a photolithography step and a first dry etching step.

18. The method according to claim 17, wherein the first dry etching step comprises using chloride gas ($Cl_2$) and $BCl_2$ as an etching gas.

19. The method according to claim 18, wherein conditions of the first etching step comprise using chloride gas ($Cl_2$) and $BCl_2$ as an etching gas with a $BCl_2$ flow rate ranging from about 55 to 65 sccm and with a $Cl_2$ flow rate ranging from about 45 to 55 sccm.

20. The method according to claim 16, wherein the conductive layer is undercut by a second dry etching step.

21. The method according to claim 20, wherein conditions of the second etching step comprises supplying a bias power in range of from about 50 to 150 W.

22. The method according to claim 20, wherein the second etching step comprises using chloride gas ($Cl_2$) and $BCl_2$ as an etching gas.

23. The method according to claim 22, wherein conditions of the second etching step comprise using chloride gas ($Cl_2$) and $BCl_2$ as an etching gas with a $Cl_2$ flow rate ranging from about 45 to 55 sccm and with a $BCl_2$ flow rate ranging from about 45 to 55 sccm.

24. The method according to claim 16, wherein the residue is removed by a third dry etching.

25. The method according to claim 24, wherein conditions of the third etching step comprise supplying a bias power in range of from about 60 to 100 W.

26. The method according to claim 24, wherein the third etching step comprises using chloride gas ($Cl_2$) and $BCl_2$ as an etching gas.

27. The method according to claim 26, wherein conditions of the third etching step comprise using chloride gas ($Cl_2$) and $BCl_2$ as an etching gas with a $Cl_2$ flow rate ranging from about 65 to 75 sccm with a $BCl_2$ flow rate ranging from about 45 to 55 sccm.

* * * * *